United States Patent [19]

Bárdos et al.

[11] Patent Number: 5,716,500
[45] Date of Patent: Feb. 10, 1998

[54] METHOD AND AN APPARATUS FOR GENERATION OF A DISCHARGE IN OWN VAPORS OF A RADIO FREQUENCY ELECTRODE FOR SUSTAINED SELF-SPUTTERING AND EVAPORATION OF THE ELECTRODE

[75] Inventors: Ladislav Bárdos; Hana Baránkova; Sören Berg, all of Upsala, Sweden

[73] Assignee: Surfcoat Oy, Mikkeli, Finland

[21] Appl. No.: 628,694

[22] PCT Filed: Oct. 12, 1994

[86] PCT No.: PCT/SE94/00959

§ 371 Date: Jun. 21, 1996

§ 102(e) Date: Jun. 21, 1996

[87] PCT Pub. No.: WO95/11322

PCT Pub. Date: Apr. 27, 1995

[30] Foreign Application Priority Data

Oct. 18, 1993 [SE] Sweden .................. 9303426

[51] Int. Cl.[6] .................. C23C 14/34; C23C 16/00
[52] U.S. Cl. .................. 204/192.12; 204/192.1; 204/298.05; 204/298.06; 204/298.07; 204/298.08; 204/298.12; 204/298.16; 204/298.21; 118/723 R; 118/723 VE; 118/723 MP; 118/723 E; 427/569; 427/580; 427/585; 427/523
[58] Field of Search .................. 204/192.1, 192.12, 204/298.05, 298.06, 298.07, 298.08, 298.16, 298.17, 298.21, 298.22, 298.24, 298.28, 298.29, 298.12; 118/723 R, 723 VE, 723 MP, 723 E; 427/523, 569, 580, 585

[56] References Cited

U.S. PATENT DOCUMENTS 4,116,794  9/1978  Penfold et al. .................. 204/298.21
3,830,721  8/1974  Gruen et al. .................. 204/298.07

(List continued on next page.)

FOREIGN PATENT DOCUMENTS 3925      9/1990  Czechoslovakia .
0166349   2/1986  European Pat. Off. .

OTHER PUBLICATIONS

"Effect of Discharge Current and Sustained Self-Sputtering", Hosokawa et al., Sep. 22–26, 1980, pp. 11–14, Proceedings of The Eighth International Vacuum Congress, vol. 1 Thin Films, Cannes France.

(List continued on next page.)

Primary Examiner—R. Bruce Breneman
Assistant Examiner—Rodney G. McDonald
Attorney, Agent, or Firm—Young & Thompson

[57] ABSTRACT

A method and apparatus for generation of a discharge in own vapors of a radio frequency electrode for sustained self-sputtering and evaporation comprising the steps of: (a) generation of a radio frequency discharge by a radio frequency electrode of a hollow geometry in an auxiliary gas introduced into the discharge area at a pressure necessary for an initiation of a hollow cathode discharge inside the hollow electrode causing sputtering and/or evaporation of the electrode surface; (b) increasing the radio frequency power to said hollow electrode to enhance density of vapors containing particles released from the electrode by the sputtering and/or evaporation in the radio frequency generated hollow cathode discharge up to a density at which a self-sustained discharge remains after the inflow of said auxiliary gas is closed and the pumping of gas is adjusted to a value necessary for the maintenance of the discharge. The hollow radio frequency electrode may serve as an inlet of said auxiliary gas.

18 Claims, 3 Drawing Sheets

U.S. PATENT DOCUMENTS

| | | | |
|---|---|---|---|
| 4,588,490 | 5/1986 | Cuomo et al. | 204/192.12 |
| 4,637,853 | 1/1987 | Bumble et al. | 204/298.12 |
| 5,073,245 | 12/1991 | Hedgcoth | 204/298.12 |

OTHER PUBLICATIONS

"Highest Rate Self–Sputtering Magnetron Source", Kukla et al., pp. 1968–1970, Great Britain, 1990.

Sustained Self–Sputtering Using a Direct Current M:agnetron Source, W. Posadowski and Z. Radzimski, J. VAc. Sci. Technol. A, vol. 11, No. 6, Nov./Dec. 1993, pp. 2980–2984.

Sustained Self–Sputtering of Copper Film Employing DC Magnetron Source, S. Shingubara et al., Oct. 5–7, 1993 San Diego, USA, Oct. 26–27, 1993, Tokyo, Japan, 2 pages.

METHOD AND AN APPARATUS FOR GENERATION OF A DISCHARGE IN OWN VAPORS OF A RADIO FREQUENCY ELECTRODE FOR SUSTAINED SELF-SPUTTERING AND EVAPORATION OF THE ELECTRODE

FIELD OF THE INVENTION

This invention relates to a method and an apparatus for generation of a discharge in own vapors of a radio frequency electrode for sustained self-sputtering of the electrode.

BACKGROUND OF THE INVENTION

The self-sputtering of an electrode-cathode by an ion bombardment in own vapor of this electrode, denoted also as the "sustained self-sputtering", is an extraordinary sputtering regime in which the discharge producing necessary ions for an ion bombardment and sputtering of an electrode is maintained in own vapors of this electrode. In this regime an evaporation of the electrode material contributes to the sputtering, because an extremely high power density typical for these discharges causes high temperature of the electrode surface. High current density connecting with heavy ion bombardment and intensive emission of electrons on the cathode surface can be assumed as particular kind of plasma arc generated in the system. Contributions of different discharge regimes to the overall production of the cathode metal vapor depend on experimental conditions, particularly on (i) the power used for generation of the discharge, (ii) cooling of the electrode, and (iii) material and geometry of the electrode. This regime was first reported by Hosokawa et al. in 1980 (Anelva Corp. Japan). In their report the cylindrical copper target was sputtered in an argon discharge generated in a cylindrical DC magnetron. When the DC power supplied into the magnetron reached the particular threshold value, a contribution of copper ions to the total ion bombardment of the target was high enough to produce high partial pressure of copper vapors to maintain the discharge without argon. In this case the inflow of argon was closed and the discharge was maintained only in pure copper vapor, released from the copper target electrode by its bombardment by Copper ions themselves. Kukla et al (1990, Leybold AG, Germany) observed this sustained self-sputtering in a planar magnetron also with a copper target using particularly optimized magnetic field for increasing the target erosion area. They reported a minimum target DC power of about 80 W/cm², necessary for an initiation of the sustained self-sputtering. In latest reports by Posadowski (1993) and Shingubara et al (1993) similar magnetron devices were used for the sustained self-sputtering of copper at power densities of about 100–250 W/cm². No other target material but copper was reported as a suitable target material for the sustained self-sputtering. The reason can be ascribed to a high sputtering yield of copper in the ion bombardment with respect to other metals. No sputtering devices were reported to generate the self-sputtering regime but magnetrons, in which the sputtering rates are relatively high due to magnetic confinement of the discharge at the target electrode (cathode) surface and low operation pressures of the gas as compared to ordinary sputtering systems. This lower operation pressure is important for maintenance of the discharge in metal vapors, because the necessary evaporation temperature of targets is lower at lower pressures and the relative density of vapors in the working gas can be therefore higher. Regardless to this advantage of magnetrons the sustained self-sputtering mode was carried out only by copper and silver targets.

In the present invention is utilized a sputtering and evaporation principle developed recently by one of the inventors (L. Bárdoš, Czech patent application 1990) for the film sputtering into hollow substrates and tubes. The sputtering is carried out in the radio frequency (RF) generated plasma jet in a working gas flowing in the hollow RF electrode, which plays role of a "hollow cathode" while the "anode" is the RF plasma itself. The hollow RF electrode can serve as a target sputtered by ions generated in the plasma jet. The electrode material can react with an active gas in the plasma jet and a product of this reaction can be deposited as a thin film onto substrate surfaces.

SUMMARY OF THE INVENTION

An object of the present invention is therefore to overcome the above described prior art discoveries and drawbacks and to provide an improved method and an apparatus for generation of a discharge in own vapors of a radio frequency electrode for sustained self-sputtering and evaporation of the electrode.

In a first aspect according to the present invention a method of generation of a discharge in own vapors of a radio frequency electrode for sustained self-sputtering and evaporation of the electrode comprises the steps of:

(a) generation of a radio frequency discharge by a radio frequency electrode of a hollow geometry in an auxiliary gas introduced into the discharge area and pumped to a pressure necessary for an initiation of a hollow cathode discharge inside the hollow radio frequency electrode, which causes sputtering and/or evaporation of the electrode surface;

(b) increasing the radio frequency power to the hollow electrode to enhance density of vapors containing particles released from the hollow electrode by the sputtering and/or evaporation in the radio frequency generated hollow cathode discharge up to a density at which a self-sustained discharge remains after the inflow of the auxiliary gas is closed and the pumping of gas from the discharge area is adjusted to a value necessary for the maintenance of the self-sustained discharge.

In a second aspect of the present invention the hollow radio frequency electrode serves as an inlet of the auxiliary gas.

In a third aspect of the present invention an apparatus is disclosed, for generation of a discharge in own vapors of a radio frequency electrode for sustained self-sputtering of the electrode according to two aspects of the preceding method, consisting of a reactor pumped by a vacuum pump, a radio frequency generator having an impedance matching unit, a gas container, and further comprising: at least one hollow radio frequency electrode hermetically installed in the reactor through an insulating vacuum feed-through and terminated by a hollow target, an auxiliary gas introduced from the gas container into the hollow target in the reactor through a gas valve, a control valve between the reactor and the vacuum pump for the pumping of the reactor, a radio frequency power supplied from the radio frequency generator through the impedance matching unit to the radio frequency electrode, a counter electrode connected to the radio frequency generator for generation of a radio frequency plasma between the radio frequency electrode and the counter electrode, a hollow cathode discharge generated by the radio frequency power and the radio frequency plasma inside the hollow target of the hollow radio frequency electrode in a mixture of auxiliary gas and vapors developed by sputtering and/or evaporation of an inner part of the hollow target.

In a fourth aspect of the present invention the hollow cathode discharge is generated at values of radio frequency power sufficient no cause intense sputtering and/or evaporation of the hollow target, the hollow cathode discharge being maintained without auxiliary gas, whereby the gas valve is closed and the pumping speed is reduced by the control valve.

In a fifth aspect of the present invention the hollow radio frequency electrode is of a tubular shape and the auxiliary gas is introduced into the hollow target through the hollow radio frequency electrode.

In a sixth aspect of the present invention the counter electrode is represented either by part of the reactor wall or by a substrate holder with substrates.

In a seventh aspect of the present invention the hollow cathode discharge in the hollow target is generated in she magnetic field produced by magnets or electromagnetic coils.

BRIEF DESCRIPTION OF THE DRAWINGS

The objects, features and advantages of the present invention as mentioned above become apparent from the description of the invention given in conjunction with the following drawings, wherein:

FIG. 1 (b) is a schematic representation of step (b) of the method according to the present invention in which an increase of the radio frequency power to the hollow radio frequency electrode causes a self-sustained discharge in vapors containing particles released from this electrode by sputtering and/or evaporation in the hollow cathode discharge without any inflow of the auxiliary gas and with the pumping adjusted to a value necessary for the maintenance of this self-sustained discharge;

DETAILED DESCRIPTION

Figure 1A:
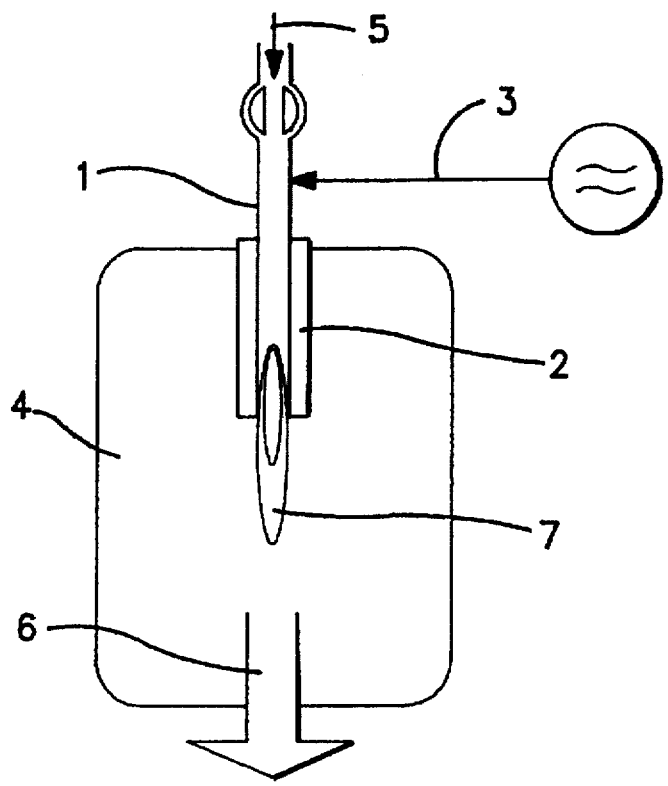
FIG. 1 (a) is a schematic representation of step (a) of the method according to the present invention in which a radio frequency discharge is generated by a radio frequency electrode of a hollow geometry in an auxiliary gas introduced into the discharge area and belts pumped to a pressure necessary for an initiation of a hollow cathode discharge inside the hollow radio frequency electrode, which causes sputtering and/or evaporation of the electrode surface.
Figure 1B:
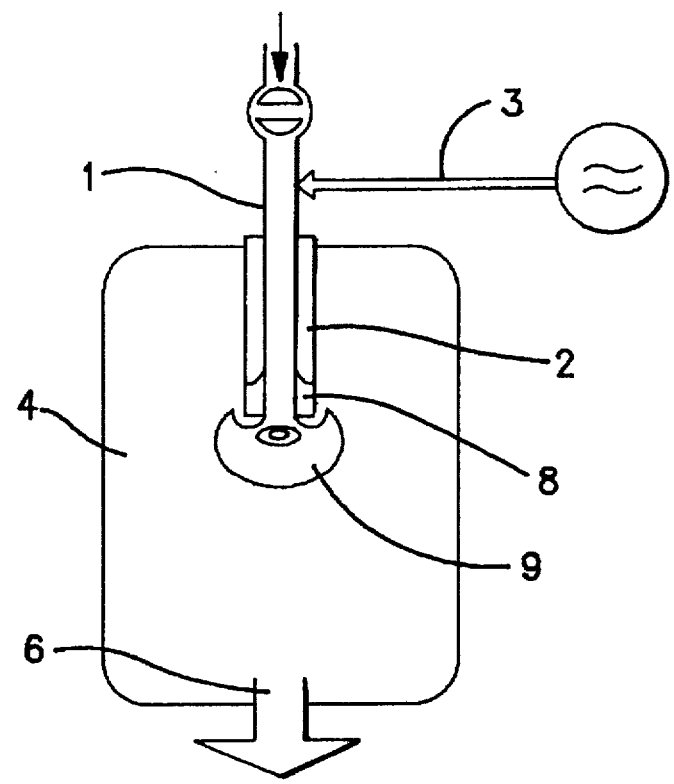

Referring to FIG. 1(a) and FIG. 1(b) of the drawings, the method according to the present invention can be described in both respective steps (a) and (b):

In FIG. 1(a) corresponding to a step (a) of the method according to the present invention a radio frequency electrode 1 of a hollow geometry, terminated by a hollow target 2, is supplied by a radio frequency power 3. The electrode 1 generates a radio frequency discharge 4 in an auxiliary gas 5, and a pumping speed 6 is adjusted to a pressure necessary for an initiation of a hollow cathode discharge 7 inside the hollow target 2 of the hollow radio frequency electrode 1. This hollow cathode discharge 7 is generated due to a negative electrical potential (known also as a "self-bias") of the hollow radio frequency electrode 1 created automatically with respect to the radio frequency plasma 4 which plays the role of a virtual anode. The hollow cathode discharge 7 causes sputtering and/or evaporation of the inner electrode surface in contact with this discharge, i.e. of an inner part of the hollow target 2 terminating the electrode 1. Thus the hollow cathode discharge 7 is excited, de facto, in a mixture of the auxiliary gas 5 and the sputtered and/or evaporated material of the hollow target 2. Density of vapors released from the hollow target 2 depends on the intensity of an ion bombardment by ions produced in the hollow cathode discharge, which is affected by the radio frequency power 3. Due to the hollow geometry of the target 2, an ion density in she hollow cathode discharge 7 can be high at relatively low power 3, as compared to ordinary sputtering systems. At the same radio frequency power 3 this effect can be higher for a smaller size of the electrode 1 and/or the target 2. An inflow of the auxiliary gas 5 into the region of the radio frequency plasma 4 and into the hollow target 2 of the hollow electrode 1 can be performed in several ways. However, generation of the hollow cathode discharge 7 can be more convenient when the electrode 1 is of a tubular shape and used for introducing the auxiliary gas 5 into the radio frequency discharge 4.

In FIG. 1(b) corresponding to a step (b) of the method according to the present invention a procedure following after the step (a) of the method is described. Increasing of the radio frequency power 3 supplied into the radio frequency electrode causes an enhanced sputtering and/or evaporation of the hollow target 2 and an erosion zone B of the hollow target 2 can be overheated by an ion bombardment. This brings about an enhanced emission of electrons from the erosion zone 8, followed by an additional ionization and by an enhanced ion bombardment of this part. Such an avalanche process results in an extreme enhancement in production of vapors containing the target material up to a qualitatively new process, when a self-sustained hollow cathode discharge 9 can burn in own vapors released from the hollow target and an inflow of the auxiliary gas 5 (noted in FIG. 1 (a)) can be closed. At such conditions the pumping speed 6 is adjusted to maintain the self sustained hollow cathode discharge 9. In most cases after closing the auxiliary gas inflow the pumping speed 6 must be reduced or pumping even stopped, depending on production of the own vapors. The radio frequency power 3 can be increased to increase the vapor production, but its maximum value is limited by a temperature stability of an overheated eroded part 8 of the hollow target 2.

Figure 2:
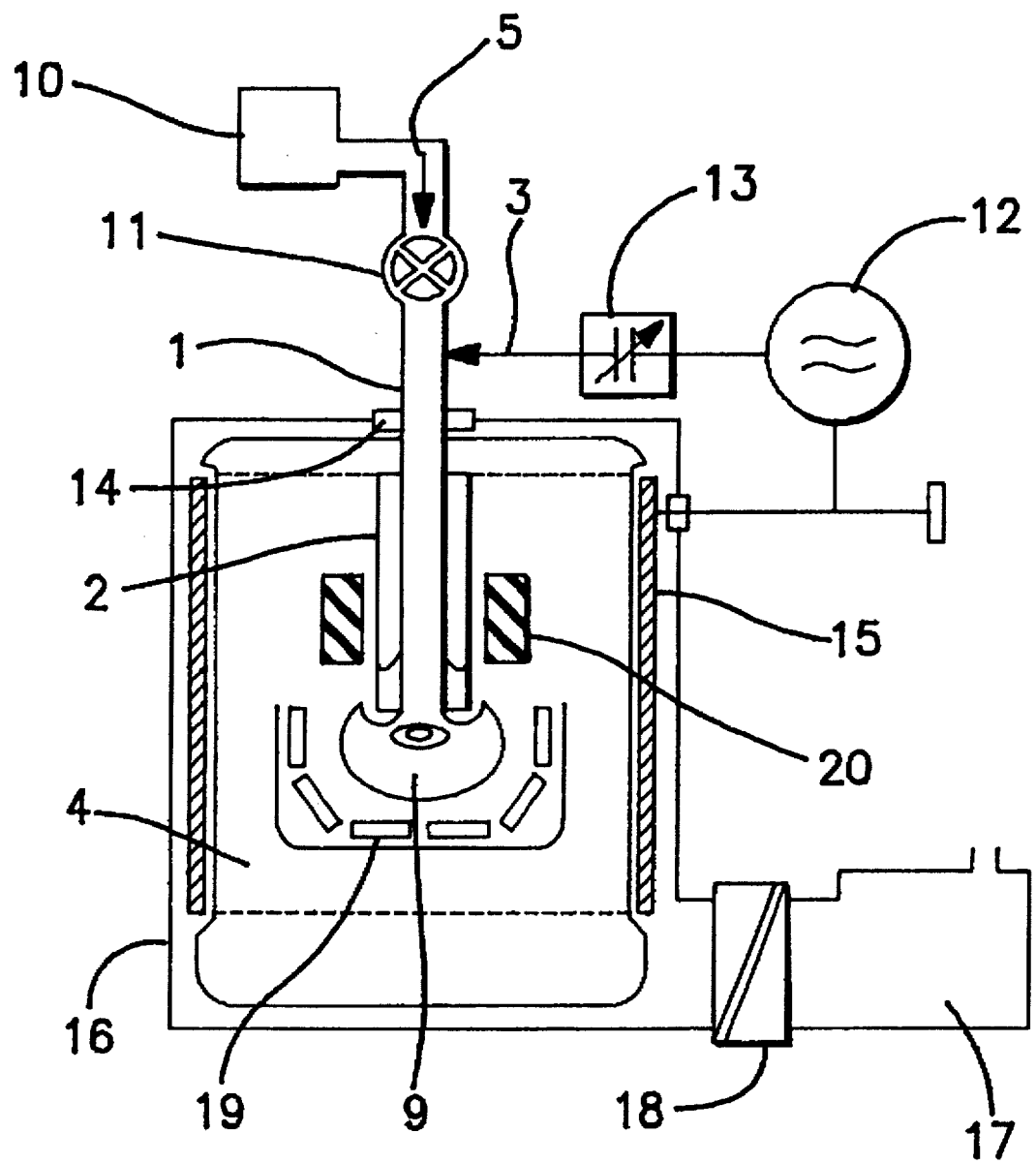
FIG. 2 is a schematic plan view of an embodiment according to the present invention showing an example of an apparatus for generation of a discharge in own vapors of a radio frequency electrode for sustained self-sputtering of the electrode according to the method of the present invention.

Referring to FIG. 2, an embodiment according to the present invention will be described in an example of an apparatus for generation of a discharge in own vapors of a radio frequency electrode for sustained self-sputtering and evaporation of the electrode according to the method described above. A hollow radio frequency electrode 1 terminated by a hollow target 2 is hermetically installed in the reactor 16 through an insulating vacuum feed-through 14. Auxiliary gas 5 is introduced into the hollow target in the reactor through a gas valve 11 from the gas container 10 and the overall gas pressure in the reactor is controlled by a control valve 18 between the reactor and the vacuum pump 17. Radio frequency power 3 is supplied to the radio frequency electrode 1 from a power pole of a radio frequency generator 12 through an impedance matching unit with a serial capacitance 13. The radio frequency circuit is completed by a counter electrode 15 connected to a counter pole of the radio frequency generator 12 and a radio frequency plasma 4 is generated between the radio frequency electrode 1 and the counter electrode 15. At sufficient power 3 a hollow cathode discharge 9 is generated inside the hollow target 2 in a mixture of the auxiliary gas 5 and vapors developed by sputtering and/or evaporation of an inner part of the hollow target 2 by said hollow cathode discharge 9. This hollow cathode discharge 9 can be generated at radio frequency power high enough to cause intense sputtering and/or evaporation of the hollow target 2, so that the hollow cathode discharge 9 is maintained only in own vapors released from the hollow target 2. At these conditions the gas valve 11 is closed and the pumping speed is reduced by the control valve 18. Both the hollow radio frequency electrode 1 and the hollow target 2 may be of a tubular shape and may be used as an inlet of auxiliary gas 5 into the reactor 16. In many cases the counter electrode 15 may be replaced by part of the reactor wall. When the apparatus is to be used for deposition of films onto substrates the role of the counter electrode may be fulfilled by a substrate holder holding the substrates 19. The hollow cathode discharge 9 in the hollow target can be generated in the magnetic field produced by magnets or electromagnetic coils 20 in this arrangement the density of the hollow cathode discharge inside the hollow target 2 can be enhanced by a magnetic confinement. This arrangement will be used also for stabilization of the hollow cathode discharge 9 at lower vapor pressure than in a case without the magnetic field.

Referring to FIG. 3, an embodiment according to the present invention shows examples of geometry of the hollow target 2 which terminates the hollow radio frequency electrode 1 in the apparatus for generation of a discharge in own vapors of a radio frequency electrode for sustained self-sputtering and evaporation of the electrode according to the present invention.

Figure 3A:
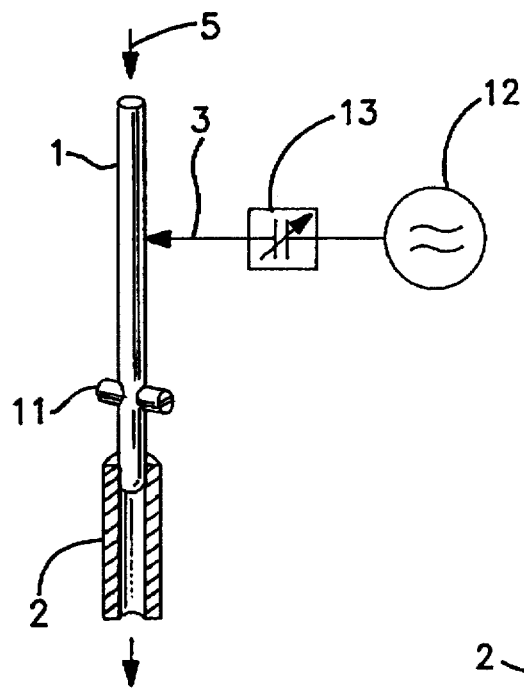
FIG. 3 is a schematic view of an embodiment according to the present invention showing examples of different geometry of the hollow target on the hollow radio frequency electrode in the apparatus of the present invention.

In FIG. 3(a) the hollow target is cylindrically shaped and mounted at the outlet of the hollow radio frequency electrode 1. The radio frequency power 3 is supplied to the radio frequency electrode 1 from a power pole of a radio frequency generator 12 through an impedance matching unit with a serial capacitance 13 and the auxiliary gas 5 is introduced into the hollow target through a gas valve 11.

Figure 3B:
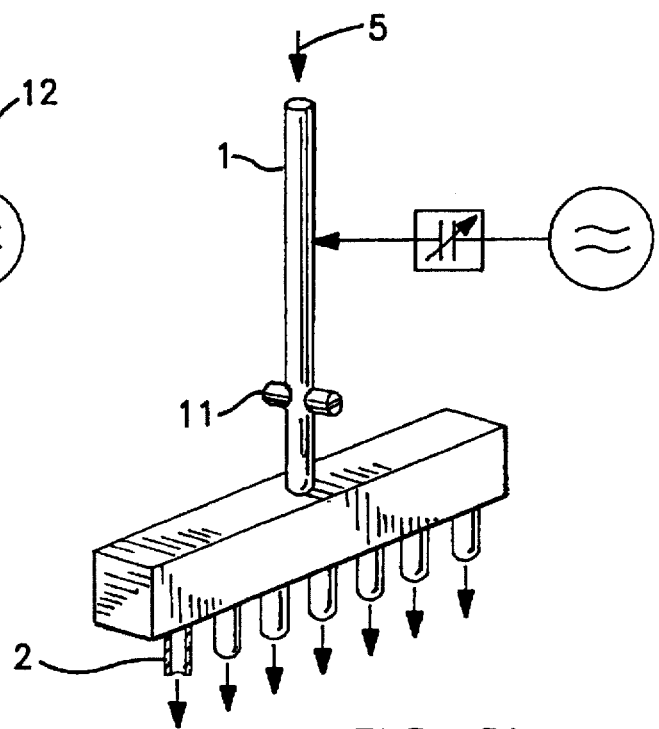
Figure 3C:
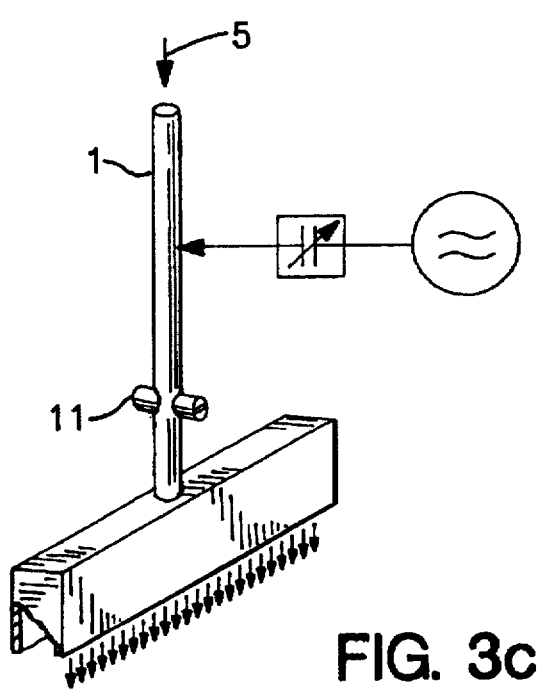

In FIG. 3(b) the hollow target 2 comprises a set of cylindrically shaped targets mounted on the hollow radio frequency electrode 1, and in FIG. 3(c) the hollow target 2 comprises at least two parallel plates of the material to be sputtered and/or evaporated.

EXAMPLES

The method and the apparatus according to the present invention can be used for generation of a discharge in own vapors for sustained self-sputtering also for metals other than copper and silver. Due to the possibility of generation of the radio frequency hollow cathode discharges in electrodes of a tubular shape with small diameters (of the order of 0.1 −1 mm), an average power permit surface might be fairly high, up to the order of kW/cm$^2$, already at a radio frequency power of the order of 100 W. Contributions of sputtered and/or evaporated material from the target due to an intense ion bombardment can therefore produce a resulting vapor pressure high enough for maintaining of arc type of the self-sustained discharge also for hard metals like Ti. An example of a typical set of process parameters for discharge in own vapors for Ti is following:

a tubular radio frequency electrode installed in the electrically grounded metallic reactor is terminated by the Ti tubular target having a measure 5 mm in outer diameter and 2 mm in inner diameter;

a radio frequency power of 150 W generates the radio frequency plasma in the reactor and it also switches on a hollow cathode discharge inside the Ti target in argon flowing in the radio frequency electrode through the target into the reactor held at pressure of about 0.5 Torr by a continuous pumping;

at radio frequency power exceeding 250 W the Ti target becomes red hot and a self-sustained discharge concentrated around the outlet of the Ti target remains stable also after closing the argon inflow followed by substantial reducing of the pumping speed;

at these conditions an optical emission from the discharge confirms the presence of pure titanium only.

In another example the radio frequency electrode with the tubular Mg target has an outer diameter 10 mm and an inner diameter 3 mm. In this case the power necessary for generation of the discharge in Ar is $\geq 50$ W. The discharge in pure magnesium vapor can be sustained at RF power $\geq 100$ W.

A discharge in own vapors of the electrode according to the present invention may favorably be combined with a certain small amount of reactive gas flowing into the hollow electrode. The contribution of this gas to the overall production of the target metal vapor is negligible but its main role is production of compounds of the target metal. This reactive process can be performed at much lower gas pressures than in conventional systems and without the presence of any carrier inert gas, Ar. Moreover, the small amount of this reactive gas is easily activated or ionized thereby enhancing the resulting rate of the plasma-chemical reactions.

A discharge in own vapors of the electrode according to the present invention can be fulfilled also for DC instead of a radio frequency generation of the hollow cathode discharge. However, the DC discharge is of worse stability than that in the radio frequency generation because in the latter case the radio frequency plasma causes a steady self pre-ionization for the hollow cathode discharge. Moreover, in DC generation the corresponding anode in a close vicinity of the hollow cathode electrode must be arranged. In radio frequency generation the role of the anode is fulfilled by the radio frequency plasma itself.

The method and the apparatus according to the present invention have an advantage particularly in applications, where local hollow parts of the substrate surface have to be deposited by films of extraordinary purity. The apparatus according to the invention can be utilized not only for the deposition of films inside hollow substrates and tubes, but also in either a multi-electrode arrangement or in a plan parallel electrode geometry for applications in large area film depositions.

We claim:

1. A method of generation of a discharge in vapors containing particles of a radio frequency electrode for sustained self-sputtering and evaporation of the electrode comprising the steps of:

(a) generation of a radio frequency discharge by a radio frequency electrode of a hollow geometry in an auxiliary gas introduced into a discharge area of said radio frequency electrode and pumped to a pressure necessary for an initiation of a hollow cathode discharge inside said hollow radio frequency electrode, which causes sputtering and evaporation of the electrode surface;

(b) increasing radio frequency power to said hollow electrode to enhance density of vapors containing particles released from said hollow electrode by said sputtering and evaporation in a radio frequency generated hollow cathode discharge, and when a density at which a self-sustained discharge remains the inflow of said auxiliary gas is stopped and the pumping of gas from the discharge area is adjusted to a value necessary for the maintenance of said self-sustained discharge.

2. The method according to claim 1, characterized in that said hollow radio frequency electrode of step (a) serves as an inlet of said auxiliary gas.

3. An apparatus for generation of a discharge in vapors containing particles of a radio frequency electrode (1) for sustained self-sputtering of an electrode comprising a reactor pumped by a vacuum pump, a radio frequency generator having an impedance matching unit and a gas container, and further comprising:

- at least one hollow radio frequency electrode (1) hermetically installed in the reactor through an insulating vacuum feed-through (14) and terminated by a hollow target (2);
- an auxiliary gas (5) introduced into said hollow target in the reactor (16) through a gas valve (11) from a gas container (10);
- a control valve (18) between said reactor and the vacuum pump (17) for pumping said reactor;
- a radio frequency power (3) supplied from a radio frequency generator (12) through the impedance matching unit (13) to said radio frequency electrode;
- a counter electrode connected to said radio frequency generator for generation of a radio frequency plasma (4) between said radio frequency electrode and said counter electrode;
- a hollow cathode discharge (9) generated by said radio frequency power and said radio frequency plasma inside said hollow target at said hollow radio frequency electrode in a mixture of said auxiliary gas and vapors developed by sputtering and evaporation of an inner part of said hollow target.

4. The apparatus according to claim 3 characterized in that said hollow cathode discharge is generated at values of radio frequency power sufficient to cause intense sputtering and evaporation of said hollow target; said hollow cathode discharge being maintained without said auxiliary gas, whereby said gas valve is closed and the pumping speed is reduced by said control valve.

5. The apparatus according to claim 3 characterized in that said hollow radio frequency electrode is tubular shaped and said auxiliary gas is introduced into said hollow target through said hollow radio frequency electrode.

6. The apparatus according to claim 3, characterized in that said counter electrode is represented either by part of the reactor wall or by a substrate holder with substrates (19).

7. The apparatus according to claim 3, characterized in that said hollow cathode discharge in said hollow target is generated in the magnetic field produced by magnets or electromagnetic coils (20).

8. The apparatus according to claim 4, characterized in that said hollow radio frequency electrode is tubular shaped and said auxiliary gas is introduced into said hollow target through said hollow radio frequency electrode.

9. The apparatus according to claim 4, characterized in that said counter electrode is represented either by part of the reactor wall or by a substrate holder with substrates (19).

10. The apparatus according to claim 5, characterized in that said counter electrode is represented either by part of the reactor wall or by a substrate holder with substrates (19).

11. The apparatus according to claim 8, characterized in that said counter electrode is represented either by part of the reactor wall or by a substrate holder with substrates (19).

12. The apparatus according to claim 5, characterized in that said hollow cathode discharge in said hollow target is generated in the magnetic field produced by magnets or electromagnetic coils (20).

13. The apparatus according to claim 6, characterized in that said hollow cathode discharge in said hollow target is generated in the magnetic field produced by magnets or electromagnetic coils (20).

14. The apparatus according to claim 8, characterized in that said hollow cathode discharge in said hollow target is generated in the magnetic field produced by magnets or electromagnetic coils (20).

15. The apparatus according to claim 9, characterized in that said hollow cathode discharge in said hollow targets is generated in the magnetic field produced by magnets or electromagnetic coils (20).

16. The apparatus according to claim 10, characterized in that said hollow cathode discharge in said hollow target is generated in the magnetic field produced by magnets or electromagnetic coils (20).

17. The apparatus according to claim 11, characterized in that said hollow cathode discharge in said hollow target is generated in the magnetic field produced by magnets or electromagnetic coils (20).

18. A method of generating a self-sustained discharge in vapors containing particles released from a radio frequency electrode, comprising the steps of:

- supplying a hollow radio frequency electrode with radio frequency power;
- pumping an auxiliary gas into a discharge area of said hollow radio frequency electrode and generating a radio frequency discharge in said auxiliary gas;
- adjusting pressure of said auxiliary gas, by pumping said auxiliary gas from said discharge area, sufficiently for initiating a hollow cathode discharge inside said hollow radio frequency electrode, and causing (a) release from said hollow radio frequency electrode of vapors, containing particles of said hollow radio frequency electrode, and (b) exciting of said hollow cathode discharge in a mixture of said auxiliary gas and said vapors;
- increasing said radio frequency power in an amount sufficient for enhancing density of said vapors and providing a self-sustained hollow cathode discharge when said pumping of said auxiliary gas is terminated;
- terminating said pumping of said auxiliary gas; and
- adjusting pumping gas from said discharge area sufficiently for maintaining said self-sustained hollow cathode discharge.

* * * * *